(12) United States Patent
Fogal et al.

(10) Patent No.: US 11,398,465 B2
(45) Date of Patent: Jul. 26, 2022

(54) PROXIMITY COUPLING INTERCONNECT PACKAGING SYSTEMS AND METHODS

(71) Applicant: Micron Technology, Inc., Boise, ID (US)

(72) Inventors: Rich Fogal, Boise, ID (US); Owen R. Fay, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/440,727

(22) Filed: Jun. 13, 2019

(65) Prior Publication Data
US 2019/0296003 A1 Sep. 26, 2019

Related U.S. Application Data

(60) Continuation of application No. 16/046,859, filed on Jul. 26, 2018, now Pat. No. 10,381,336, which is a
(Continued)

(51) Int. Cl.
*H01L 25/00* (2006.01)
*H01L 25/18* (2006.01)
(Continued)

(52) U.S. Cl.
CPC .......... *H01L 25/50* (2013.01); *H01L 21/4817* (2013.01); *H01L 21/54* (2013.01);
(Continued)

(58) Field of Classification Search
CPC ............. H01L 23/3128; H01L 23/5222; H01L 23/5223; H01L 23/5386; H01L 23/642;
(Continued)

(56) References Cited

U.S. PATENT DOCUMENTS

| 7,525,199 B1 * | 4/2009 | Lauterbach ............. H01L 23/48 |
| | | 257/723 |
| 9,595,513 B2 | 3/2017 | Fogal et al. |
| | (Continued) | |

OTHER PUBLICATIONS

Ouyang, J., et al., "Evaluation of Using Inductive/Capacitive-Coupling Vertical Interconnects in 3D Network-on-Chip", International Conference on Computer-Aided Design (ICCAD), 2010 IEEE/ACM, Nov. 2010, pp. 477-482, DOI 10.1109/ICCAD.2010.5653769.

*Primary Examiner* — Aaron J Gray
(74) *Attorney, Agent, or Firm* — Perkins Coie LLP

(57) ABSTRACT

Proximity coupling interconnect packaging systems and methods. A semiconductor package assembly comprises a substrate, a first semiconductor die disposed adjacent the substrate, and a second semiconductor die stacked over the first semiconductor die. There is at least one proximity coupling interconnect between the first semiconductor die and the second semiconductor die, the proximity coupling interconnect comprising a first conductive pad on the first coupling face on the first semiconductor die and a second conductive pad on a second coupling face of the second semiconductor die, the second conductive pad spaced apart from the first conductive pad by a gap distance and aligned with the first conductive pad. An electrical connector is positioned laterally apart from the proximity coupling interconnect and extends between the second semiconductor die and the substrate, the position of the electrical connector defining the alignment of the first conductive pad and the second conductive pad.

16 Claims, 5 Drawing Sheets

Related U.S. Application Data continuation of application No. 15/422,230, filed on Feb. 1, 2017, now Pat. No. 10,062,678, which is a division of application No. 14/556,450, filed on Dec. 1, 2014, now Pat. No. 9,595,513.

(51) Int. Cl.

| | | |
|---|---|---|
| *H01L 25/065* | (2006.01) | |
| *H01L 23/00* | (2006.01) | |
| *H01L 23/48* | (2006.01) | |
| *H01L 23/31* | (2006.01) | |
| *H01L 23/522* | (2006.01) | |
| *H01L 23/538* | (2006.01) | |
| *H01L 21/48* | (2006.01) | |
| *H01L 21/54* | (2006.01) | |

(52) U.S. Cl.
CPC ........ *H01L 23/3128* (2013.01); *H01L 23/481* (2013.01); *H01L 23/5222* (2013.01); *H01L 23/5223* (2013.01); *H01L 23/5386* (2013.01); *H01L 24/17* (2013.01); *H01L 24/81* (2013.01); *H01L 25/0652* (2013.01); *H01L 25/0657* (2013.01); *H01L 25/18* (2013.01); *H01L 2224/0401* (2013.01); *H01L 2224/0557* (2013.01); *H01L 2224/05567* (2013.01); *H01L 2224/05568* (2013.01); *H01L 2224/16145* (2013.01); *H01L 2224/16227* (2013.01); *H01L 2224/32225* (2013.01); *H01L 2224/48091* (2013.01); *H01L 2224/48227* (2013.01); *H01L 2224/73204* (2013.01); *H01L 2224/8136* (2013.01); *H01L 2224/81143* (2013.01); *H01L 2224/81815* (2013.01); *H01L 2224/92125* (2013.01); *H01L 2224/92247* (2013.01); *H01L 2225/06513* (2013.01); *H01L 2225/06517* (2013.01); *H01L 2225/06527* (2013.01); *H01L 2225/06531* (2013.01); *H01L 2225/06541* (2013.01); *H01L 2225/06562* (2013.01); *H01L 2225/06589* (2013.01); *H01L 2924/14* (2013.01); *H01L 2924/1431* (2013.01); *H01L 2924/1434* (2013.01); *H01L 2924/1436* (2013.01); *H01L 2924/15311* (2013.01); *H01L 2924/163* (2013.01); *H01L 2924/16251* (2013.01); *H01L 2924/181* (2013.01); *H01L 2924/2064* (2013.01)

(58) Field of Classification Search
CPC ....... H01L 23/645; H01L 24/63; H01L 24/81; H01L 25/18; H01L 25/50; H01L 25/0657; H01L 25/0652; H01L 2225/06534; H01L 2225/06531
See application file for complete search history.

(56) References Cited

U.S. PATENT DOCUMENTS

| | | | |
|---|---|---|---|
| 2002/0016021 A1* | 2/2002 | Sutherland | H01L 23/642 257/E25.011 |
| 2008/0150157 A1* | 6/2008 | Nishimura | H01L 24/29 257/737 |
| 2009/0089466 A1 | 4/2009 | Cunningham et al. | |
| 2009/0315157 A1 | 12/2009 | Drost et al. | |
| 2010/0289156 A1* | 11/2010 | Iguchi | H01L 25/18 257/777 |
| 2011/0057291 A1 | 3/2011 | Slupsky et al. | |
| 2011/0254123 A1* | 10/2011 | Sellathamby | H01L 23/645 257/E23.01 |
| 2012/0049360 A1 | 3/2012 | Lai et al. | |
| 2012/0091575 A1 | 4/2012 | Lai et al. | |
| 2012/0230695 A1 | 9/2012 | O'Krafka et al. | |
| 2012/0292745 A1* | 11/2012 | Park | H01L 25/50 257/E21.705 |
| 2013/0002039 A1 | 1/2013 | Kusamitsu et al. | |
| 2016/0155729 A1 | 6/2016 | Fay et al. | |
| 2017/0141096 A1 | 5/2017 | Fogal et al. | |

\* cited by examiner

PROXIMITY COUPLING INTERCONNECT PACKAGING SYSTEMS AND METHODS

CROSS-REFERENCE TO RELATED APPLICATIONS

This application is a continuation of U.S. patent application Ser. No. 16/046,859, filed Jul. 26, 2018; which is a continuation of U.S. patent application Ser. No. 15/422,230, filed Feb. 1, 2017, now U.S. Pat. No. 10,062,678; which is a divisional of U.S. patent application Ser. No. 14/556,450, filed Dec. 1, 2014, now U.S. Pat. No. 9,595,513; each of which is incorporated herein by reference.

TECHNICAL FIELD

The disclosed embodiments relate to semiconductor devices and more particularly to proximity coupling interconnects between semiconductor dies and packages therefor.

BACKGROUND

In semiconductor processing, interconnects are used to provide electrical connection between adjacent semiconductor dies. For vertically stacked semiconductor dies, through-silicon vias (TSV) are often used. Such TSVs on adjacent semiconductor dies are typically electrically connected to each other using direct physical coupling in which the bond pads of one die are directly bonded to the bond pads of the other.

Direct bonding of interconnects requires relatively large bond pads (e.g., 45×45 microns or larger) and also results in relatively high power consumption and current drop. Proximity coupling, which is an alternative to direct bonding, involves positioning the conductive pads of one die adjacent to, but physically separated from, the conductive pads of another die. In proximity coupling, there is a gap that is not filled with a conductive material between the adjacent pairs of bond pads. Proximity coupling interconnects rely on either magnetic flux (inductive coupling) or electric field (capacitive coupling) to serve as the medium through which signals are transmitted between the adjacent conductive pads. Proximity coupling can achieve lower power consumption and lower current drop than direct physical coupling. Additionally, proximity coupling can be utilized with significantly smaller conductive pads (e.g., on the order of 5×5 microns, 20×20 microns, or larger). However, the use of smaller conductive pads for proximity coupling also requires more precise alignment between adjacent conductive pads. Additionally, the vertical distance between the adjacent conductive pads must be controlled precisely to achieve effective coupling. While proximity coupling interconnects have been demonstrated in principle, there remains a need to develop practical methods to incorporate proximity coupling interconnects into packaging systems and methods utilizing standard semiconductor processing techniques.

DETAILED DESCRIPTION

Specific details of several embodiments of semiconductor die assemblies having proximity coupling interconnects and associated systems and methods are described below. The term "semiconductor die" generally refers to a die having integrated circuits or components, data storage elements, processing components, and/or other features manufactured on semiconductor substrates. For example, semiconductor dies can include integrated circuit memory and/or logic circuitry. A person skilled in the relevant art will also understand that the technology may have additional embodiments, and that the technology may be practiced without several of the details of the embodiments described below with reference to FIGS. 1A-5.

As used herein, the terms "vertical," "lateral," "upper," and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 1A:
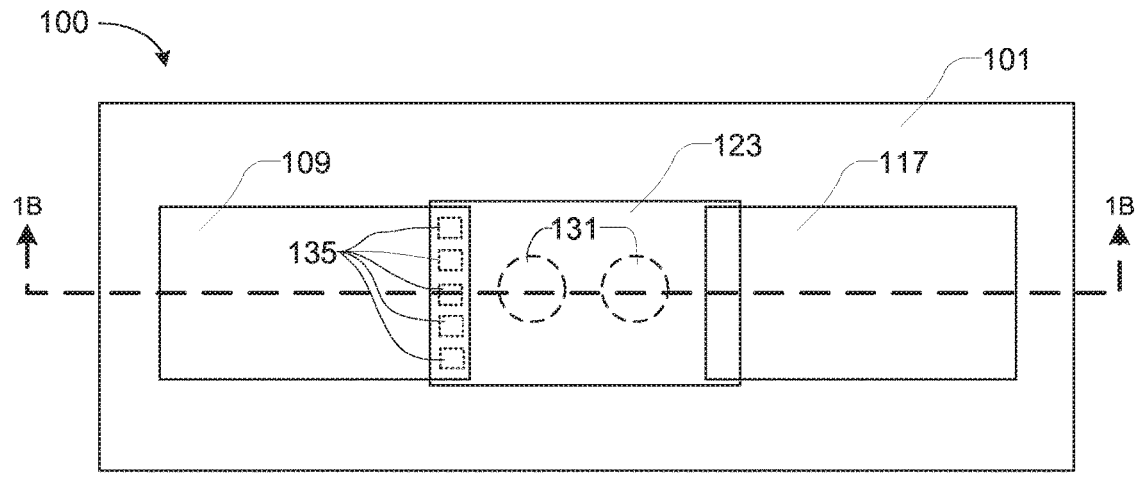
FIG. 1A is a top plan view illustrating a portion of a semiconductor die assembly in accordance with embodiments of the present technology.
Figure 1B:
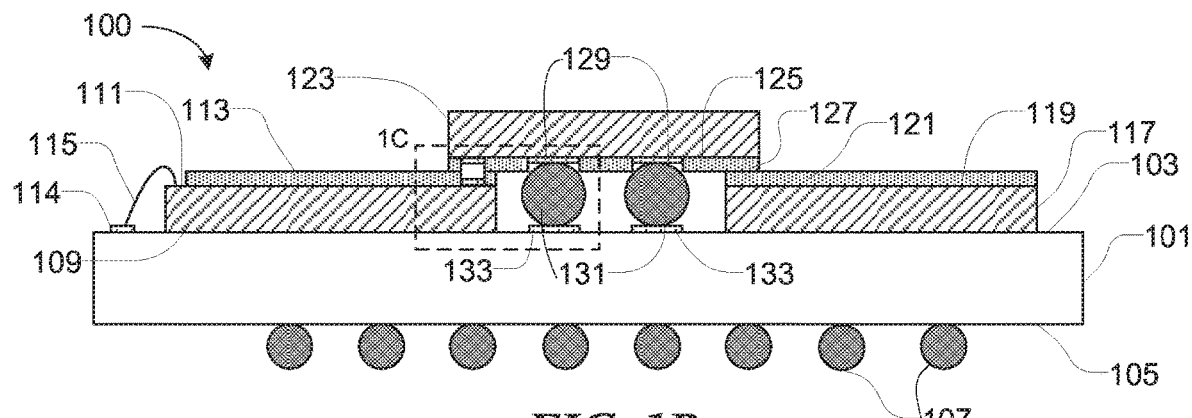
FIG. 1B is a cross-sectional view of the semiconductor die assembly shown in FIG. 1A.
Figure 1C:
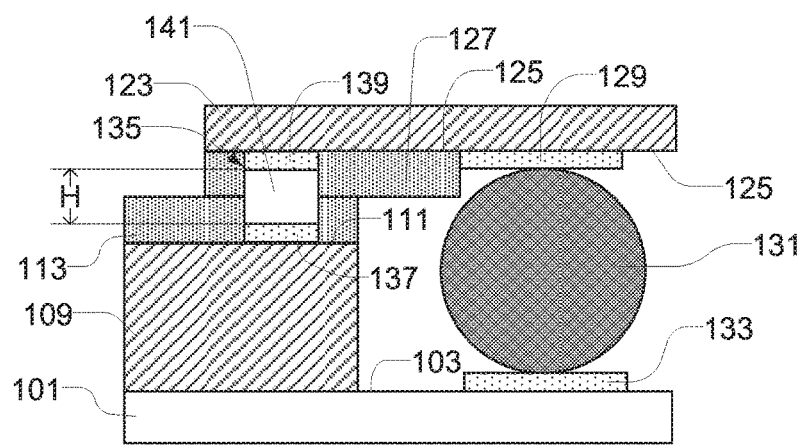
FIG. 1C is an enlarged detail view of a portion of the semiconductor die assembly shown in FIG. 1B.

FIGS. 1A and 1B illustrate top plan and cross-sectional views, respectively, of a semiconductor die assembly 100 in accordance with the present technology. FIG. 1C illustrates an enlarged detail view of a portion of the assembly 100 shown in FIG. 1B. Referring to FIGS. 1A-C together the assembly 100 includes a first die 109 (e.g., a memory die) and a spacer 117 disposed over a substrate 101. The substrate 101 has an upper surface 103 and a lower surface 105. The substrate 101 can include a plurality of solder bumps 107 disposed on the lower surface 105 for mounting the assembly 100 to a printed circuit board or other chip (not shown) and a plurality of alignment pads 133 on the upper surface 103. As explained in more detail below, the alignment pads 133 can be electrically conductive bond pads that also provide additional alignment features for the components on the substrate 101.

The first die 109 is disposed on the upper surface 103 of the substrate 101 and can be attached to the substrate 101 via conventional die attach methods such as adhesive paste, tape, or films. The first die 109 includes a coupling face 111 that faces away from the substrate 101, and a passivation layer 113 is disposed over the coupling face 111 of the first die 109. The passivation layer 113 can include polyimide, silicon nitride, silicon dioxide, titanium dioxide, aluminum oxide, or other suitable materials. The first die 109 can be electrically coupled to a contact pad 114 on the substrate 101 via a wirebond 115. In some embodiments, the first die 109 can be electrically coupled to the substrate 101 via through-silicon vias or other techniques.

The spacer 117 is disposed at a location on the upper surface 103 of the substrate 101 that is spaced laterally apart from the first die 109. The spacer 117 can be attached to the substrate 101 via conventional die attach methods such as adhesive paste, tape, or films. The spacer 117, for example, can be a dummy die or other type of die. The spacer 117 includes a coupling face 119 that faces away from the substrate 101, and a passivation layer 121 is disposed over the coupling face 119 of the spacer 117. The passivation layer 121 can include polyimide, silicon nitride, silicon dioxide, titanium dioxide, aluminum oxide, or other suitable dielectric materials. In the illustrated embodiment, the first die 109 has the same thickness as the spacer 117, and the passivation layer 113 on the first die 109 has the same thickness as the passivation layer 121 on the spacer 117. In some embodiments, the passivation layer 121 can be omitted from the spacer 117, in which case the spacer 117 may be configured to have an overall thickness equivalent to the thickness of the first die 109 and the passivation layer 113. In some embodiments, the thickness of the passivation layer 121 on the spacer 117 can have a different thickness than the passivation layer 113 on the first die 109.

The assembly 100 can further include a second die 123 (e.g., a logic die) disposed over both the first die 109 and the spacer 117. The second die 123 includes a coupling face 125 that faces the first die 109 and the spacer 117 as well as the substrate 101, and another passivation layer 127 is disposed on the coupling face 125 of the second die 123. The passivation layer 127 can include polyimide, silicon nitride, silicon dioxide, titanium dioxide, aluminum oxide, or other suitable dielectric materials. The second die 123 can further include a plurality of bond pads 129 disposed on the coupling face 125. In the illustrated embodiment, the passivation layer 127 may have openings that expose the bond pads 129.

The assembly 100 can further include connectors 131 that extend between the logic die bond pads 129 and corresponding alignment pads 133 disposed on the upper surface 103 of the substrate 101. The connectors 131 can be electrically conductive, and each connector 131 may be fused and bonded with one of the bond pads 129 on the second die 123 as well as fused and bonded with one of the alignment pads 133 on the substrate 101. For example, the connectors 131 can be large solder elements. In the illustrated embodiment, two connectors 131 are illustrated. However, in various embodiments an array of connectors 131 corresponding to the number of required electrical connections can be used. The alignment pads 133 on the substrate 101 are disposed laterally between the first die 109 and the spacer 117. The alignment pads 133 can also be electrically connected to traces or other conductive lines in the substrate 101. The alignment pads 133, therefore, can act as regular bond pads for electrically coupling the second die 123 to the substrate 101. In some embodiments, the dimensions of the connectors 131 and/or the dimensions of the bond pads 129 can define the spacing between the substrate 101 and the second die 123. In some embodiments, an underfill material can be disposed between the substrate 101 and the second die 123 so as to substantially surround the connectors 131.

In the illustrated embodiment, the first die 109 and the spacer 117 are disposed on the substrate 101 with a second die 123 disposed over the first die 109 and the spacer 117. In some embodiments, the various semiconductor dies can take different forms. For example, a logic die may be disposed on the substrate and a memory die may be disposed over the logic die. In other embodiments, different semiconductor dies may be used, and need not be limited to memory dies, logic dies, and/or spacers.

The assembly 100 further includes a plurality of proximity coupling interconnects 135 (FIG. 1A) that each have a first conductive pad 137 disposed on the coupling face 111 of the first die 109, a second conductive pad 139 disposed on the coupling face 125 of the second die 123, and a gap 141 (e.g., void or other space) between the first conductive pad 137 and the second conductive pad 139. The first conductive pad 137 is exposed through the passivation layer 113 on the first die 109, and the second conductive pad 139 is exposed through the passivation layer 127 on the second die 123. In some embodiments, the first conductive pad 137 and the second conductive pad 139 can each be sized between about 5 microns by about 5 microns to about 25 microns by 25 microns. In some embodiments, the first conductive pad 137 and the second conductive pad 139 can each be sized at less than about 5 microns by about 5 microns, or greater than about 25 microns by about 25 microns. In the embodiment shown in FIG. 1A, five proximity coupling interconnects 135 are illustrated for clarity. However, in various embodiments an array of up to 100, 1000, or more proximity coupling interconnects can be provided for communication between one semiconductor die and another.

The gap 141 between the first conductive pad 137 and the second conductive pad 139 can have a height H selected to provide the appropriate electrical properties for the proximity coupling interconnect 135. The gap 141 may be an empty void, or it can be filled with a gas, a solid, or a dielectric material or another material having the appropriate electrical properties for forming a proximity coupling interconnect. In some embodiments, the proximity coupling interconnect 135 can be a capacitive coupling interconnect, in which case the first conductive pad 137 and the second conductive pad 139 each act as a capacitive plate. In such a capacitive coupling interconnect 135, the electric field between the first capacitive plate and the second capacitive plate serves as the medium through which signals are transmitted between the first die 109 and the second die 123. In other embodiments, the proximity coupling interconnect 135 can be an inductive coupling interconnect, in which case the first conductive pad 137 and the second conductive pad 139 can include conductive coil patterns to induce magnetic flux between the first conductive pad 137 and the second conductive pad 139. In some embodiments, capacitive coupling interconnects and inductive coupling interconnects can both be used as proximity coupling interconnects between the first die 109 and the second die 123. The gap height H can significantly influence the performance of the proximity coupling interconnect 135. In some embodiments, the gap height H can be between about 1 micron and about 10 microns. In some embodiments, the gap height H can be greater than 10 microns. The desired gap height H can be varied based on many parameters, such as the size and material of the first conductive pad 137 and second conductive pad 139, the presence or absence of any fill material in the gap 141, etc. In some embodiments, the thicknesses of the passivation layers 113 and 127 can be controlled to define the gap height H. For example, in some embodiments the gap height H is defined by the sum of the thicknesses of the passivation layers 113 and 127 less the thicknesses of the first and second conductive pads 137 and 139. In one embodiment, each passivation layer 113, 127 can have a thickness that extends about 5 microns beyond the respective conductive pads 137, 139, resulting in a gap height H of about 10 microns. In some embodiments, the size of connectors 131 can define the gap height H. For example, a larger connector 131 may result in the second die 123—and therefore the second conductive pad 139—achieving a position further from the first die 109 and the first conductive pad 137.

The use of proximity coupling interconnects provides several advantages over direct bonding. For example, the conductive pads used for proximity coupling interconnects can often be significantly smaller than bond pads used for direct bonding such that arrays of proximity coupling interconnects can have very fine pitches. The reduced footprint of the conductive pads also introduces tighter alignment tolerances to achieve effective communication between opposing conductive pads and to reduce cross-talk between adjacent conductive pads. The assembly 100 illustrated in FIGS. 1A-C can achieve precise alignment between the first conductive pad 137 and the second conductive pad 139 because of the interaction between the connectors 131 and the second die 123. For example, the alignment pads 133 can be formed at precise locations on the upper surface 103 of the substrate 101 using conventional semiconductor processing techniques. Based on the position of the alignment pads 133, the first die 109 can be placed at a predefined position with respect to the alignment pads 133 such that the first conductive pad 137 is positioned precisely at a known location relative to the alignment pads 133. The second die 123 can be placed, but not fixedly attached, using a flip-chip technique such that the connectors 131 are substantially aligned between the alignment pads 133 on the substrate 101 and the bond pads 129 on the second die 123. At this point, the second die 123 is free to move laterally because it is not yet fixedly attached. This level of alignment can be achieved using conventional flip-chip approach, as the alignment pads 133 and bond pads 129 can be larger than the first conductive pad 137 and the second conductive pad 139 of the proximity coupling interconnect 135. Upon reflow, the connectors 131 liquefy and the surface tension of the connectors 131 automatically refines the lateral position and/or elevation of the unattached second die 123 such that the bond pads 129 are more precisely aligned with the alignment pads 133. This in turn precisely aligns the first conductive pad 137 and the second conductive pad 139. The spacing between the first conductive pad 137 and the second conductive pad 139 can be based, at least in part, on the volume of the connectors 131.

Figure 2A:
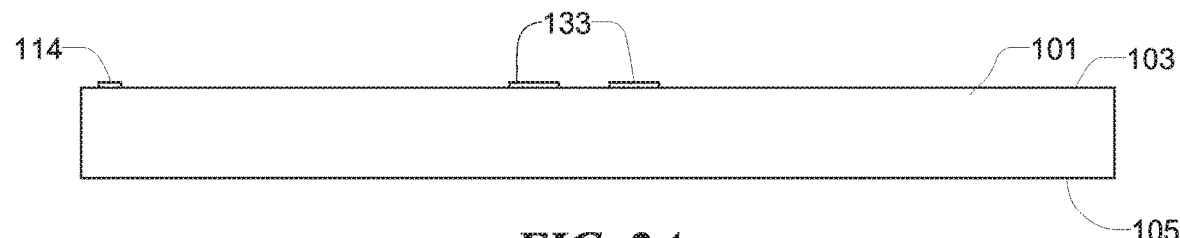
FIGS. 2A-2G are cross-sectional views illustrating a method of manufacturing a semiconductor die assembly in accordance with embodiments of the present technology.
Figure 2B:
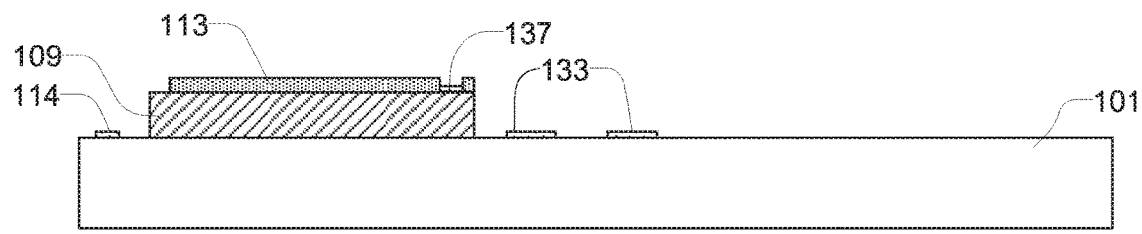

FIGS. 2A-2G are cross-sectional views illustrating a method of manufacturing a semiconductor die assembly in accordance with embodiments of the present technology. Like reference numbers refer to like components in FIGS. 1-2G. Referring to FIG. 2A, contact pads 114 (only one shown) and alignment pads 133 can be formed or deposited on the upper surface 103 of the substrate 101. FIG. 2B illustrates the assembly after the first die 109 has been mounted onto the upper surface 103 of the substrate 101. In the illustrated embodiment, the first die 109 includes the passivation layer 113 and the first conductive pad 137 before the first die 109 is mounted to the substrate 101. The first die 109 can be mounted using conventional techniques such as tape, films, or adhesive paste such that the first die 109 is accurately placed at a predetermined position with respect to the alignment pads 133. The relative position of the alignment pads 133 and the first conductive pad 137 contributes to ultimate alignment of the proximity coupling interconnect, as described in more detail below.

Figure 2C:
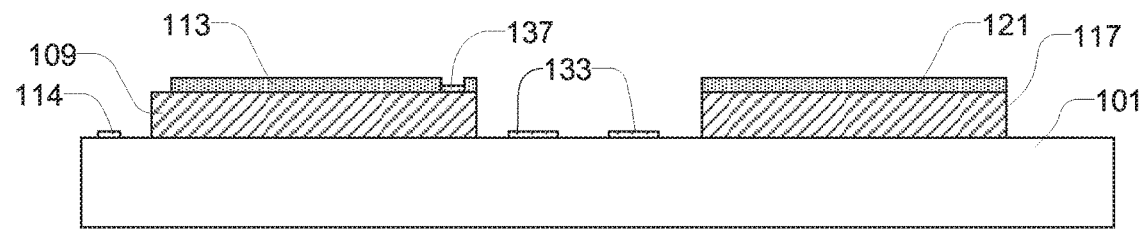
Figure 2D:
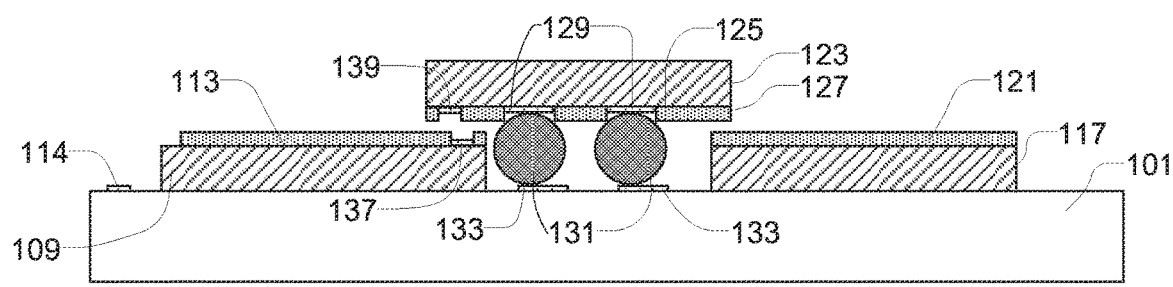

Referring now to FIG. 2C, the spacer 117 can be mounted onto the substrate 101 at a position spaced laterally from the first die 109. As illustrated, the alignment pads 133 are disposed between the first die 109 and the spacer 117. In this embodiment, the passivation layer 121 has been disposed over the surface of the spacer 117 before the spacer 117 is mounted to the substrate 101. The overall height of the first die 109 and the spacer 117 can be the same. FIG. 2D shows the system after the second die 123 has been disposed over the first die 109, and the spacer 117. The second die 123 includes a coupling face 125 that faces the first die 109, a passivation layer 127, bond pads 129 and at least one second conductive pad 139. Connectors 131 are coupled to the bond pads 129 to provide electrical and mechanical connection between the second die 123 and the substrate 101. The second conductive pad 139 is configured to form a proximity coupling interconnect along with the first conductive pad 137.

Figure 2E:
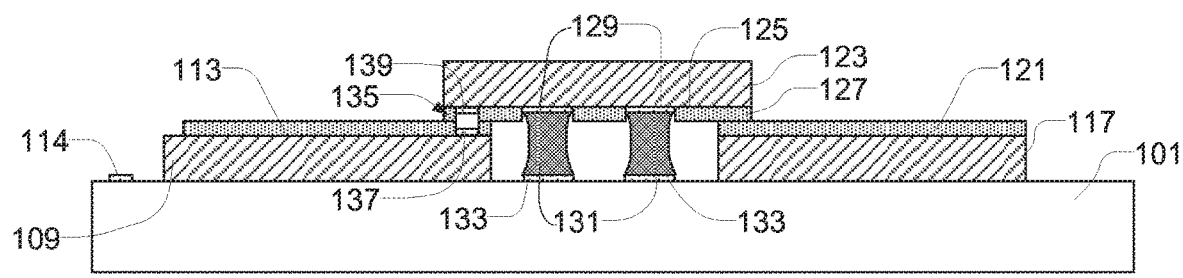

As illustrated in FIG. 2D, the second die 123 need not be precisely aligned with the first die 109, such that the first conductive pad 137 is not precisely aligned with the second conductive pad 139. Referring to FIG. 2E, the entire assembly can be heated to reflow the connectors 131. In this process, the surface tension of the liquefied connectors 131 automatically pulls the second die 123 into alignment with respect to the alignment pads 133. As a result, the first conductive pad 137 is also aligned with the second conductive pad 139 to form the proximity coupling interconnect 135. As noted above, the proximity coupling interconnect 135 can be a capacitive coupling interconnect or an inductive coupling interconnect. In some embodiments, the height of the gap between the first conductive pad 137 and the second conductive pad 139 can be defined at least in part by the thickness of the passivation layer 113 on the first die 109, the thickness of the passivation layer 121 on the spacer 117, and the thickness of the passivation layer 127 on the second die 123. In some embodiments, the height of the gap between the first conductive pad 137 and the second conductive pad 139 can be defined at least in part by the size of the connectors 131. Although only one proximity coupling interconnect 135 is shown in FIG. 2E, in practice the first die 109 has a plurality of first conductive pads 137 and the second die 123 has a plurality of second conductive pads 139 arranged in corresponding arrays. As such, the precise alignment caused by reflowing the connectors 131 to accurately position the second die 123 enables fine pitch arrays of small conductive pads 137, 139 to form a fine pitch array of proximity coupling interconnects 135.

Figure 2F:
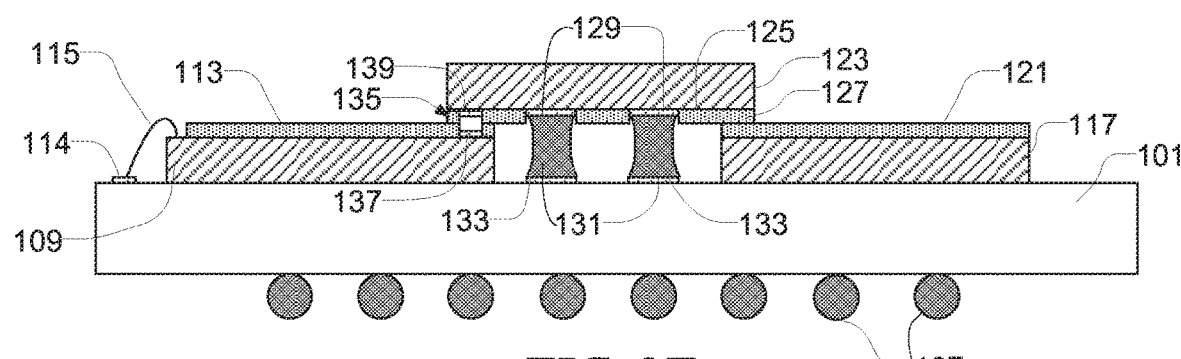
Figure 2G:
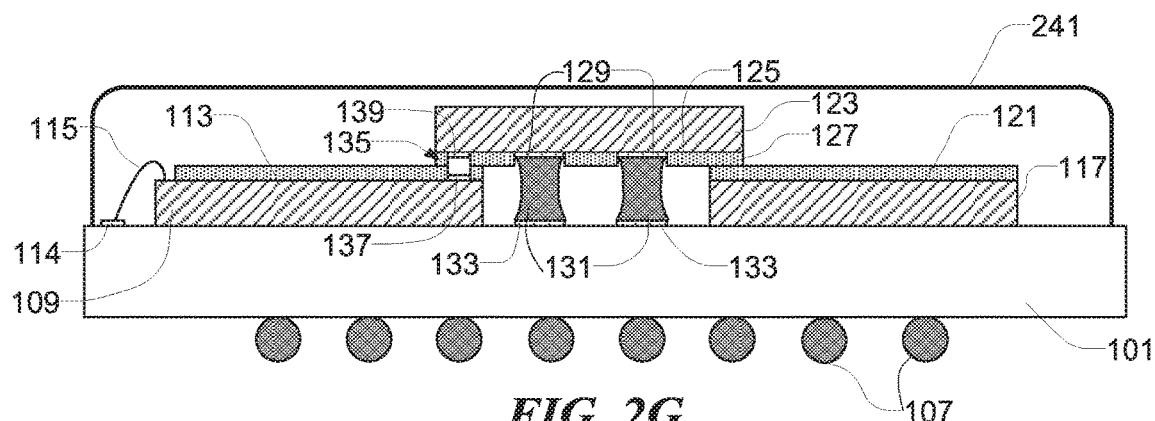

Referring to FIG. 2F, the first die 109 is electrically coupled to the substrate 101 via wirebonds 115 (only one shown) attached to contact pads 114 (only one shown). FIG. 2G shows the assembly after a thermal lid 241 has been mounted to the substrate 101 to encapsulate the assembly, including the first die 109, the second die 123, and the spacer 117. In some embodiments, a thermal interface material or other material having a low coefficient of thermal expansion can be dispensed over the substrate 101 prior to attachment of the thermal lid 241. In some embodiments, the space between the thermal lid 241 and the substrate 101 can be backfilled with a material such as a thermal interface material or other material having a low coefficient of thermal expansion.

Figure 3:
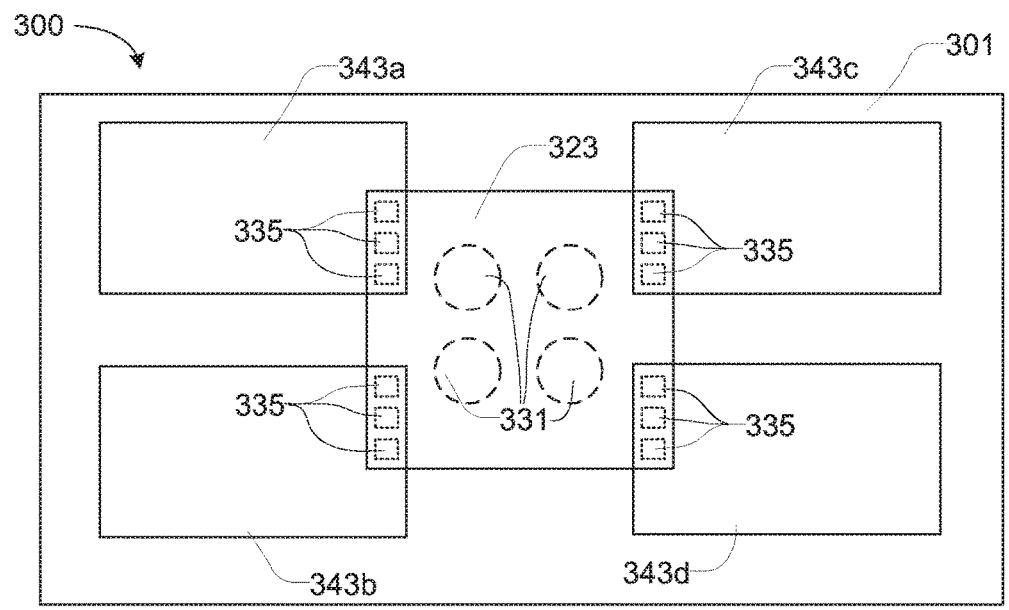
FIG. 3 illustrates a top plan view of another embodiment of a semiconductor die assembly in accordance with the present technology.

FIG. 3 illustrates a top plan view of another embodiment of a semiconductor die assembly 300 in accordance with the present technology. The assembly 300 includes a substrate 301 and a plurality of first semiconductor dies 343*a-d* (collectively dies 343) mounted on its surface. The first semiconductor dies 343 can be, for example, DRAM dies or other memory dies, and they can be mounted to the substrate 301 using conventional techniques such as adhesive paste, tape, or films. A second semiconductor die 323 is mounted over a portion of each of the first semiconductor dies 343a-d. The second semiconductor die 323 can be, for example, a logic die mounted into position using a flip-chip technique over connectors 331 which couple the second semiconductor die 323 to the substrate 301. A plurality of proximity coupling interconnects 335 can be formed between the second semiconductor die 323 and each of the first semiconductor dies 343a-d. The proximity coupling interconnects 335 can have conductive pads spaced apart by a gap similar to those described above with respect to FIGS. 1A-2H. In some embodiments, one or more of the first semiconductor dies 343a-d can be replaced with a spacer. Although three proximity coupling interconnects 335 are shown between the second semiconductor die 323 and each of the first semiconductor dies 343a-d, most devices have a large number (e.g., in the tens, hundreds, or thousands) of proximity coupling interconnects between one semiconductor die and another. Similarly, although four connectors 331 are illustrated, most devices have a larger array of connectors.

Figure 4:
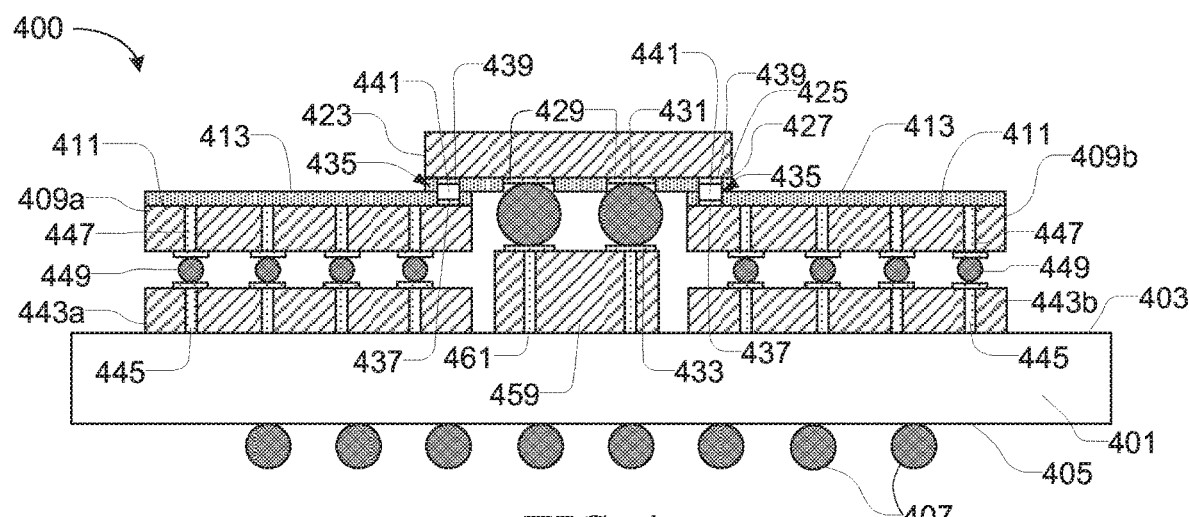
FIG. 4 illustrates a cross-sectional view of another embodiment of a semiconductor die assembly in accordance with the present technology.

FIG. 4 illustrates a cross-sectional view of another embodiment of a semiconductor die assembly 400 in accordance with the present technology. The assembly 400 includes a substrate 401 having an upper surface 403 and a lower surface 405, and a plurality of solder bumps 407 disposed on the lower surface 405 for mounting the assembly 400 to a printed circuit board or other chip (not shown). The assembly 400 also has a plurality of first semiconductor dies 409a-b disposed over the upper surface 403 of the substrate 401, and the one first die 409a is spaced laterally apart from the other first die 409b. The first semiconductor dies 409a-b include a coupling face 411, a passivation layer 413 over the coupling face 411, and a first conductive pad 437 on the coupling face. In this embodiment, the assembly 400 also has a second semiconductor die 423 disposed over the first semiconductor dies 409a-b. The second semiconductor die 423 includes a coupling face 425 that faces the first semiconductor dies 409a-b as well as the substrate 401, a passivation layer 427 disposed on the coupling face 425, and a plurality of bond pads 429 disposed on the coupling face 425. The assembly 400 can have connectors 431 coupled to each of the bond pads 429 on the coupling face 425 of the second semiconductor die 423.

The assembly 400 also includes a plurality of proximity coupling interconnects 435 that each have a first conductive pad 437 and a second conductive pad 439. The first conductive pads 437 are opened through the passivation layers 413 on the first semiconductor dies 409a-b, and the second conductive pads 439 are opened through the passivation layer 427 on the second semiconductor die 423. In some embodiments, the first conductive pads 437 and the second conductive pads 439 can each be sized between about 5 microns by about 5 microns to about 25 microns by 25 microns. In some embodiments, the first conductive pads 437 and the second conductive pads 439 can each be sized at less than about 5 microns by about 5 microns, or greater than about 25 microns by about 25 microns.

The above features of the embodiment illustrated in FIG. 4 can be substantially similar to those shown in FIGS. 1A-C. However, as shown in FIG. 4, the first semiconductor dies 409a-b and the connectors 431 are all not connected directly to the substrate 401. Rather, they are stacked over additional semiconductor dies or spacers having through-silicon vias. For example, the assembly 400 can have third semiconductor dies 443a-b disposed over the upper surface 403 of the substrate 401. The first semiconductor die 409a is stacked over the third semiconductor die 443a, the first semiconductor die 409b is stacked over the third semiconductor die 443b, and through-silicon vias 445 electrically couple the first semiconductor dies 409a-b and/or the third semiconductor dies 443a-b to each other through interconnects 449 and through-silicon vias 447. The through-silicon vis 445 also electrically couple the third semiconductor dies 443a-b to the substrate 401.

The assembly 400 can further include a fourth semiconductor die 459 or spacer disposed over the upper surface 403 of the substrate 401 at a position laterally between the third semiconductor dies 443a-b. The fourth semiconductor die 459 can include through-silicon vias 461 that are electrically coupled to alignment pads 433, which are coupled to corresponding bond pads 429 of the second semiconductor die 423 via connectors 431.

The assembly 400 can provide precise alignment between the first conductive pads 437 and the second conductive pads 439 while taking advantage of the benefits of vertical stacking. Alignment can be achieved due to the interaction between the connectors 431 and the second semiconductor die 423. The fourth semiconductor die 459 can be placed on the upper surface 403 of the substrate 401 using conventional semiconductor processing techniques. Based on the position of the fourth semiconductor die 459, and in particular the alignment pads 433, the third semiconductor dies 443a-b can be placed at predefined positions with respect to the alignment pads 433 of the fourth semiconductor die 459. The first semiconductor dies 409a-b can be stacked over the third semiconductor dies 443a-b using conventional techniques, and can be aligned such that the first conductive pads 437 are in predetermined positions with respect to the alignment pads 433 of the fourth semiconductor die 459. The second semiconductor die 423 can then be placed using a flip-chip technique such that the connectors 431 are aligned between the alignment pads 433 on the fourth semiconductor die 459 and the bond pads 429 on the second semiconductor die 423. This level of alignment can be achieved using conventional flip-chip approach, as the alignment pads 433 and the bond pads 429 can be larger than the first conductive pads 437 and the second conductive pads 439 of the proximity coupling interconnect 435. Upon reflow, the connectors 431 liquefy and the surface tension automatically causes alignment between the bond pads 429 and the alignment pads 433, which correspondingly results in alignment of the first conductive pads 437 and the second conductive pads 439.

Figure 5:
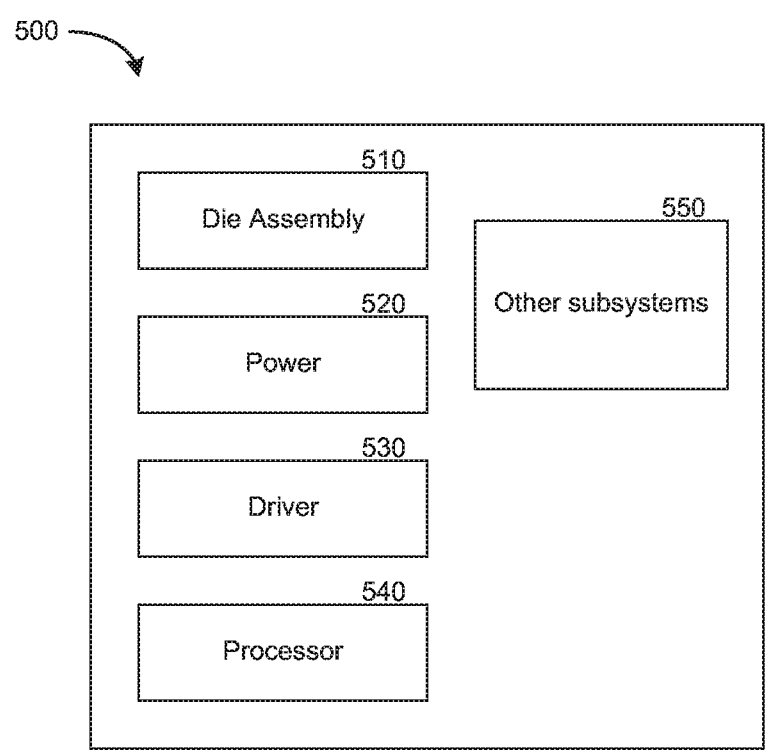
FIG. 5 is a schematic view of a system that includes a semiconductor die assembly configured in accordance with embodiments of the present technology.

Any one of the semiconductor dies described above with reference to FIGS. 1A-4 can be incorporated into any of a myriad of larger and/or more complex systems, a representative example of which is system 500 shown schematically in FIG. 5. The system 500 can include a semiconductor die assembly 510, a power source 520, a driver 530, a processor 540, and/or other subsystems or components 550. The semiconductor die assembly 510 can include features generally similar to those of the stacked semiconductor die assemblies described above, and can therefore include a plurality of proximity coupling interconnects having improved electrical performance. The resulting system 500 can perform any of a wide variety of functions, such as memory storage, data processing, and/or other suitable functions. Accordingly, representative systems 500 can include, without limitation, hand-held devices (e.g., mobile phones, tablets, digital readers, and digital audio players), computers, and appliances. Components of the system 500 may be housed in a single unit or distributed over multiple, interconnected units (e.g., through a communications network).

The components of the system 500 can also include remote devices and any of a wide variety of computer-readable media.

From the foregoing, it will be appreciated that specific embodiments of the invention have been described herein for purposes of illustration, but that various modifications may be made without deviating from the disclosure. Certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A method for manufacturing a semiconductor package assembly, the method comprising:
disposing a first semiconductor die adjacent to a substrate having bond pads, the first semiconductor die having a first coupling face that faces away from the substrate;
disposing a second semiconductor die adjacent to the substrate and spaced laterally apart from the first semiconductor die, the second semiconductor die having a second coupling face that faces away from the substrate, wherein the second semiconductor die is a dummy die; and
stacking a third semiconductor die over the first semiconductor die and the second semiconductor die, the third semiconductor die having a third coupling face and bond pads at the third coupling face, the third coupling face facing but not contacting the first coupling face and facing but not contacting the second coupling face;
wherein stacking the third semiconductor die includes aligning a third conductive pad on the third coupling face with a first conductive pad on the first coupling face to form a first proximity coupling interconnect,
wherein the third conductive pad is spaced from the first conductive pad by a first gap distance,
wherein no proximity coupling interconnect is formed between the third semiconductor die and the second semiconductor die,
wherein one or more electrical connectors extend between a corresponding one of the bond pads of the third semiconductor die and a corresponding one of the bond pads of the substrate and are positioned between the first semiconductor die and the second semiconductor die; and
wherein an opening vertically extends through a first passivation layer formed on the first coupling face and a third passivation layer formed on the third coupling face and extends between a surface of the first conductive pad and a surface of the third conductive pad, wherein the sum of a height of the opening and a thickness of the first and third conductive pads equals the sum of a thickness of the first passivation layer and a thickness of the third passivation layer.

2. The method of claim 1, further comprising:
positioning the one or more electrical connectors laterally apart from the first proximity coupling interconnect.

3. The method of claim 2, wherein the position of the electrical connector defines the alignment of the first conductive pad and the third conductive pad.

4. The method of claim 1, wherein the first and third passivation layers define the first gap distance between the first conductive pad and the third conductive pad.

5. The method of claim 1, wherein the first proximity coupling interconnect comprises a capacitive coupling interconnect or an inductive coupling interconnect.

6. The method of claim 1, wherein the first gap distance is about 1 microns to about 10 microns.

7. The method of claim 1, wherein the first semiconductor die comprises a memory die.

8. The method of claim 1, wherein the third semiconductor die comprises a logic die.

9. The method of claim 1, further comprising coupling a thermal lid to the substrate, the thermal lid enclosing the first semiconductor die, the second semiconductor die and the third semiconductor die.

10. The method of claim 9, further comprising disposing a thermal fill material between the thermal lid and the first semiconductor die, the second semiconductor die and the third semiconductor die.

11. The method of claim 1, further comprising disposing an underfill material between the third semiconductor die and the substrate.

12. The method of claim 1, wherein the third semiconductor die extends over at least the bond pads on the substrate.

13. A method of manufacturing a semiconductor package assembly, the method comprising:
disposing a third semiconductor die over a first semiconductor die and a second semiconductor die, wherein the third semiconductor die has a third coupling face having a first portion that overlaps but does not contact a first coupling face of the first semiconductor die and a second portion that overlaps but does not contact a second coupling face of the second semiconductor die, and wherein the second semiconductor die is a dummy die; and
aligning a first pad on the first coupling face and a third pad on the third coupling face to form a first proximity coupling interconnect between the first semiconductor die and the third semiconductor die, wherein the first pad is spaced apart from the third pad by a first open space;
wherein no proximity coupling interconnect is formed between the third semiconductor die and the second semiconductor die,
wherein a spacing structure projecting from a third portion of the third coupling face that does not overlap the first coupling face or the second coupling face defines a first gap between the first pad and the third pad; and
wherein an opening vertically extends through a first passivation layer formed on the first coupling face and a third passivation layer formed on the third coupling face and extends between a surface of the first pad and a surface of the third pad, wherein the sum of a height of the opening and a thickness of the first and third pads equals the sum of a thickness of the first passivation layer and a thickness of the third passivation layer.

14. The semiconductor package assembly of claim 13, wherein the first proximity coupling interconnect comprises a capacitive coupling interconnect or an inductive coupling interconnect.

15. The semiconductor package assembly of claim 13, wherein the spacing structure comprises a solder interconnect spaced laterally apart from the first proximity coupling interconnect and extending between the third portion of the third coupling face and a substrate.

16. The semiconductor package assembly of claim 13, wherein first pad is spaced from the third pad by a distance from about 1 microns to about 10 microns.

\* \* \* \* \*